(12) United States Patent
Garg et al.

(10) Patent No.: US 8,207,754 B2
(45) Date of Patent: Jun. 26, 2012

(54) ARCHITECTURE FOR EFFICIENT USAGE OF IO

(75) Inventors: Paras Garg, Uttar Pradesh (IN); Saiyid Mohammad Irshad Rizvi, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 4 days.

(21) Appl. No.: 12/391,944

(22) Filed: Feb. 24, 2009

(65) Prior Publication Data

US 2010/0213980 A1 Aug. 26, 2010

(51) Int. Cl.
*H03K 19/0175* (2006.01)
(52) U.S. Cl. ............. 326/80; 326/63; 326/86; 326/113; 327/109; 327/112; 327/333
(58) Field of Classification Search .................... 326/63, 326/68, 80–83, 86, 112–113; 327/108–109, 327/112, 333
See application file for complete search history.

(56) References Cited

U.S. PATENT DOCUMENTS

| | | | | |
|---|---|---|---|---|
| 4,375,625 A * | 3/1983 | Lee | ............................... | 333/213 |
| 5,862,390 A * | 1/1999 | Ranjan | ......................... | 713/300 |
| 6,249,145 B1 * | 6/2001 | Tanaka et al. | ................... | 326/68 |
| 6,441,643 B1 * | 8/2002 | Chan et al. | ....................... | 326/81 |
| 6,674,313 B2 * | 1/2004 | Kurisu et al. | ................. | 327/108 |
| 6,693,450 B1 * | 2/2004 | Volk et al. | ........................ | 326/30 |
| 7,091,767 B2 * | 8/2006 | Tanaka et al. | ................. | 327/333 |
| 7,151,391 B2 * | 12/2006 | Chen et al. | ....................... | 326/68 |
| 7,215,144 B2 * | 5/2007 | Mitby et al. | ..................... | 326/82 |
| 7,626,423 B1 * | 12/2009 | Li et al. | ........................... | 326/86 |
| 7,653,505 B1 * | 1/2010 | Simmons et al. | ............. | 702/118 |
| 2003/0193351 A1 * | 10/2003 | Fukui | ............................... | 326/83 |
| 2004/0145394 A1 * | 7/2004 | Nedachi | ........................ | 327/112 |
| 2005/0091629 A1 * | 4/2005 | Eisenstadt et al. | .............. | 716/13 |
| 2006/0083079 A1 * | 4/2006 | Hwang et al. | ............ | 365/189.09 |
| 2007/0195604 A1 * | 8/2007 | Kim | ......................... | 365/185.23 |
| 2008/0007314 A1 * | 1/2008 | Ricard et al. | .................. | 327/333 |

* cited by examiner

*Primary Examiner* — Jason M Crawford
(74) *Attorney, Agent, or Firm* — Seed IP Law Group PLLC

(57) ABSTRACT

An IO buffer module optimized for a wide range of drive levels both in terms of area and performance that includes an IO cell module and at least one IO adder module operatively coupled to said IO cell module for enabling the IO buffer module for the wide range of drive levels. The IO adder module can be added with the IO cell module in a number of different combinations for providing the wide range of drive levels, and the IO buffer module can provide drive solutions from 1 mA to 10 mA or higher, in steps of 0.5 mA drive level.

17 Claims, 9 Drawing Sheets

ARCHITECTURE FOR EFFICIENT USAGE OF IO

BACKGROUND

1. Technical Field

The present disclosure relates to input output (IO) buffers and, more specifically, to an architecture and methodology for efficient usage of IO buffers that are optimized both in terms of area and performance.

2. Description of the Related Art

Rapid advances in semiconductor technology are driving the move of reducing device geometries and lower operating supply voltages. Several designs that operate reliably in an earlier device geometry or operating supply voltage fail to perform efficiently in the changed environment, resulting in the need for a redesign. This is especially true for IO buffers since these structures are required to interface to off-chip devices and drive significant loads. Standard drive level IO buffers do not provide an optimized solution in terms of area and performance.

FIG. 1(a) illustrates a known high voltage IO buffer and FIG. 1(b) illustrates a known low voltage IO buffer. It is observed that if the high voltage design is migrated to the lower supply voltage environment, it becomes necessary to increase the size of the buffer (height "H" micrometers (μm) and width "W" micrometers (μm)) since the device of the original size provides a significantly reduced drive at the low supply voltage. This change is implemented in the low-voltage design by increasing the width of the IO buffer (by "X" μm) and increasing the height of NMOS buffers by "a" μm, the height of the PMOS buffers by "b" μm and the height of the pre-driver by "c" μm. Since the overall height of the cell has to remain the same as before, these height increases results in a reduced available height for the logic area.

BRIEF SUMMARY

In accordance with one embodiment of the present disclosure, a system is provided, the system including an IO buffer that has an IO cell module including an interface that provides output drive control signals; and one or more IO adder modules coupled to the output of said interface.

In accordance with another aspect of the foregoing embodiment, the IO cell module includes an IO control logic generating output drive control signals coupled to said interface; a predriver having its input coupled to the output drive control signals; and a PMOS driver and an NMOS driver having their inputs coupled to the outputs of the predriver.

In accordance with another aspect of the foregoing embodiment, the module includes a drive level logic coupled to the interface; and a PMOS driver and an NMOS driver having their inputs coupled to the output of the predriver.

In accordance with another aspect of the foregoing embodiment, the pre-driver ideally includes inputs formed at a same height as output nodes of the level shifter in the IO cell module. Preferably, coupling of the level shifter to the predriver includes metal connections in the IO adder module that extend out of the left boundary of the IO cell module so that when they are abutted to the IO cell module they are shorted with the output nodes of the level shifter in the IO cell module.

In accordance with another embodiment of the present disclosure, an I/O input/output buffer module is provided, the module including an IO cell module including an interface that provides output drive control signals; and one or more IO adder modules coupled to the output of the interface.

In accordance with another aspect of the foregoing embodiment, the buffer module includes an IO control logic generating output drive control signals coupled to the interface; a predriver having its input coupled to the output drive control signals; and a PMOS driver and an NMOS driver having their inputs coupled to the outputs of the predriver.

In accordance with another aspect of the foregoing embodiment, the buffer module includes a drive level logic coupled to the interface; and a PMOS driver and an NMOS driver having their inputs coupled to the output of the predriver.

In accordance with a method of the present disclosure, an IO buffer module is optimized for a wide range of drive levels by coupling one or more IO adder modules to the IO cell module for enabling the IO buffer module for the wide range of drive levels.

In accordance with another embodiment of the present disclosure, a circuit is provided that includes an IO (input/output) buffer module, the IO buffer including an IO cell module having an interface that provides output drive control signals; and one or more IO adder modules coupled to the output of the interface.

BRIEF DESCRIPTION OF THE SEVERAL VIEWS OF DRAWINGS

The aforementioned aspects and other features of the present disclosure will be explained in the following description, taken in conjunction with the accompanying drawings, wherein.

DETAILED DESCRIPTION

Figures 1A, 1B:
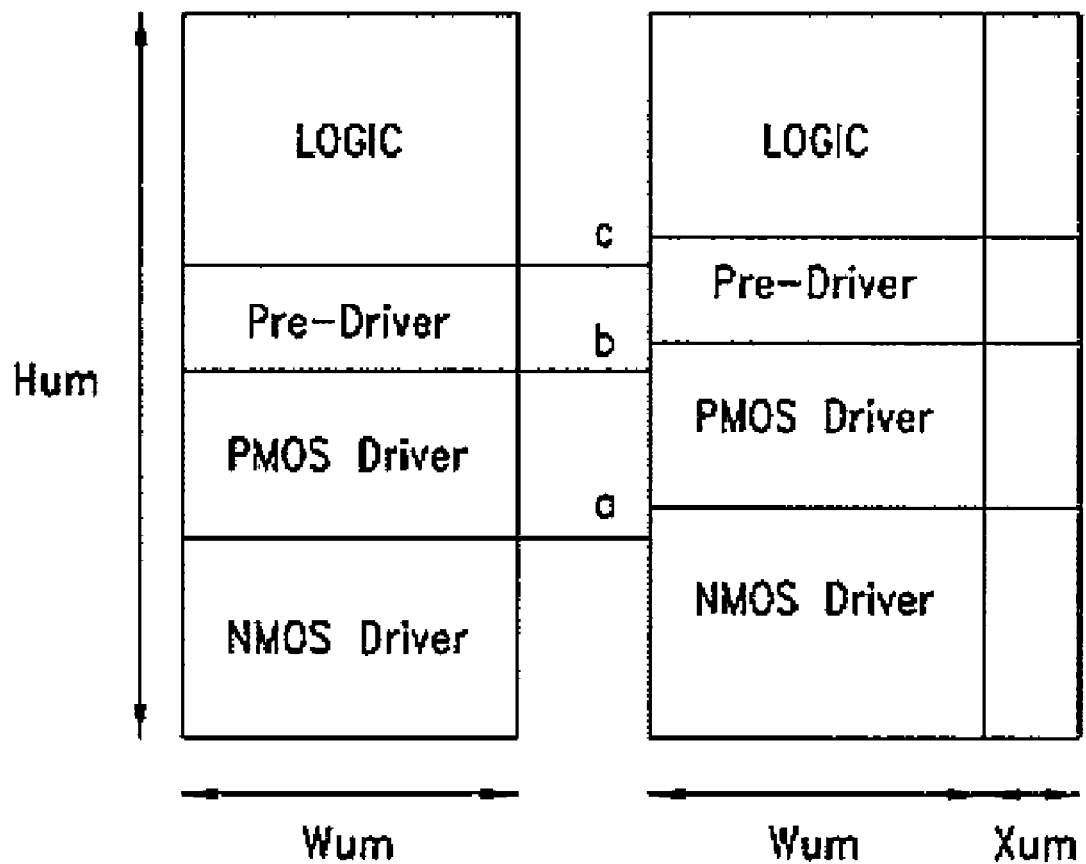
FIGS. 1A-1B illustrate a conventional high voltage IO buffer, and a conventional low voltage IO buffer.

The embodiments of the present disclosure will now be described in detail with reference to the accompanying drawings. However, the present disclosure is not limited to the embodiments. The present disclosure can be modified in various forms. Thus, the embodiments of the present disclosure are only provided to explain more clearly the present disclosure to the ordinarily skilled in the art of the present disclosure. In the accompanying drawings, like reference numerals are used to indicate like components.

The present disclosure provides an IO buffer module optimized for a wide range of drive levels. The IO buffer module includes an IO cell module, and one or more IO adder module operatively coupled to the IO cell module for enabling the IO buffer module for a wide range of drive levels. The IO adder module architecture includes a drive programmable logic, a predriver, PMOS driver and an NMOS driver. The IO adder module is placed at the same height as the IO cell module. The inter-connection of the modules includes metal connections.

Figure 2:
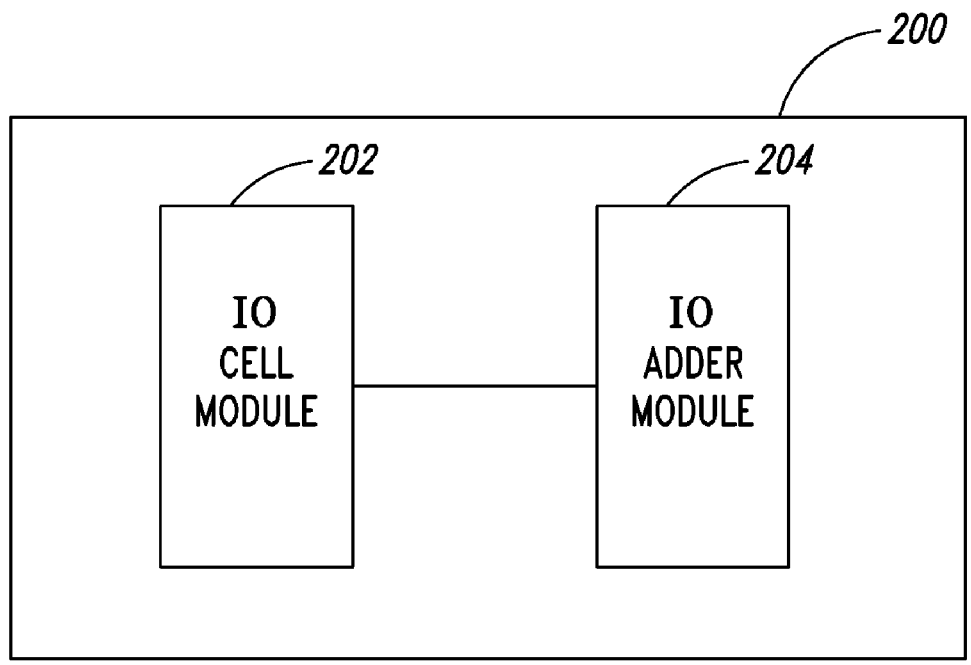
FIG. 2 illustrates a block diagram of an IO buffer module according to an embodiment of the present disclosure.

FIG. 2 illustrates a block diagram of an IO buffer module according to an embodiment of the present disclosure. The IO buffer module 200 includes an IO cell module 202 and at least one IO adder module 204. The IO adder module 204 is operatively coupled to any one side of the IO cell module 202 for enabling the IO buffer module 200, to provide a wide range of drive level solutions such as 1 mA to 10 mA or even higher, in steps of 0.5 mA.

Figure 3:
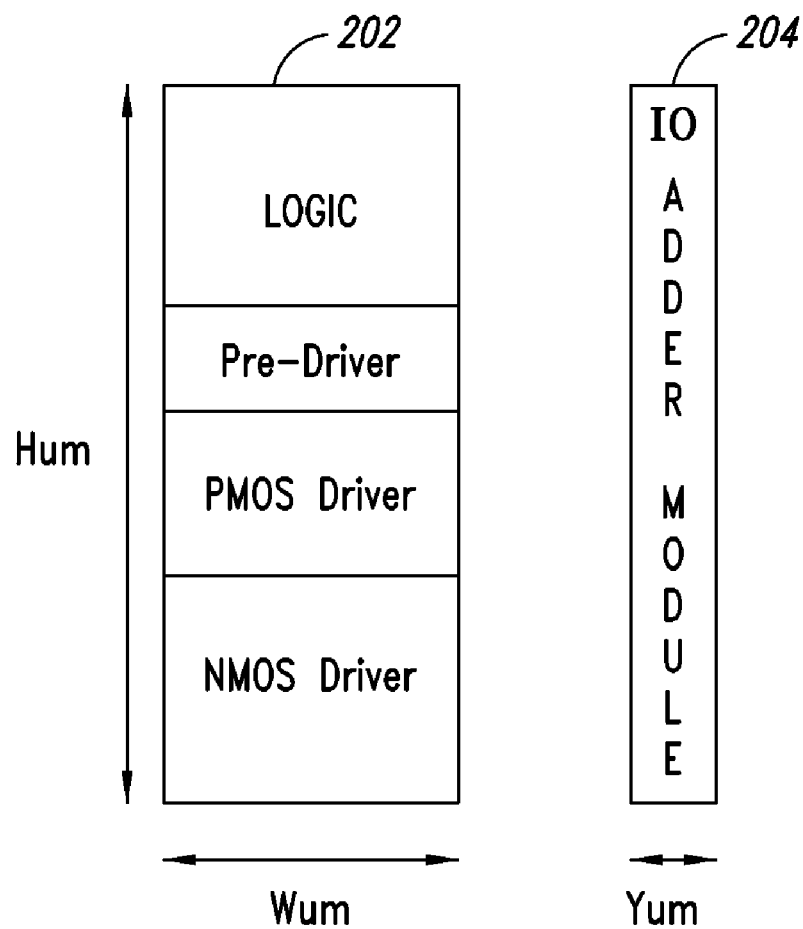
FIG. 3 illustrates a formation of IO buffer and an IO adder module according to an embodiment of the present disclosure.

FIG. 3 illustrates an IO buffer 202 operable at low supply and a separate IO adder module 204 according to another embodiment of the present disclosure. This IO adder module 204 is Hμm (in height) and Yμm (in width).

Figure 4:
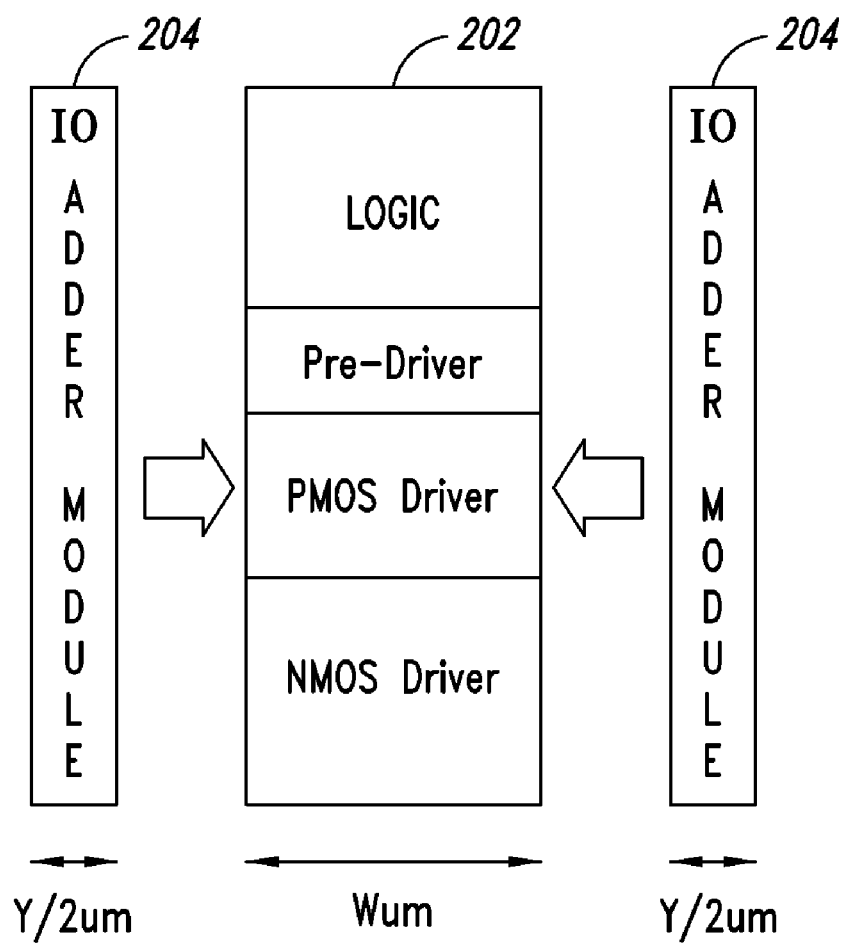
FIG. 4 illustrates a formation of an improved low supply IO buffer structure, an IO adder module split in two according to another embodiment of the present disclosure.

FIG. 4 illustrates an improved IO buffer structure at low supply, with an IO adder module placed on either side of the IO buffer module. These two IO adder modules are derived from the IO adder module 204, by splitting them in two equal parts across the width. Further, by splitting the IO adder modules in two parts and placing them at two positions allows for more wide range drive level solutions without comprising on the development cost and chip area.

Figure 5:
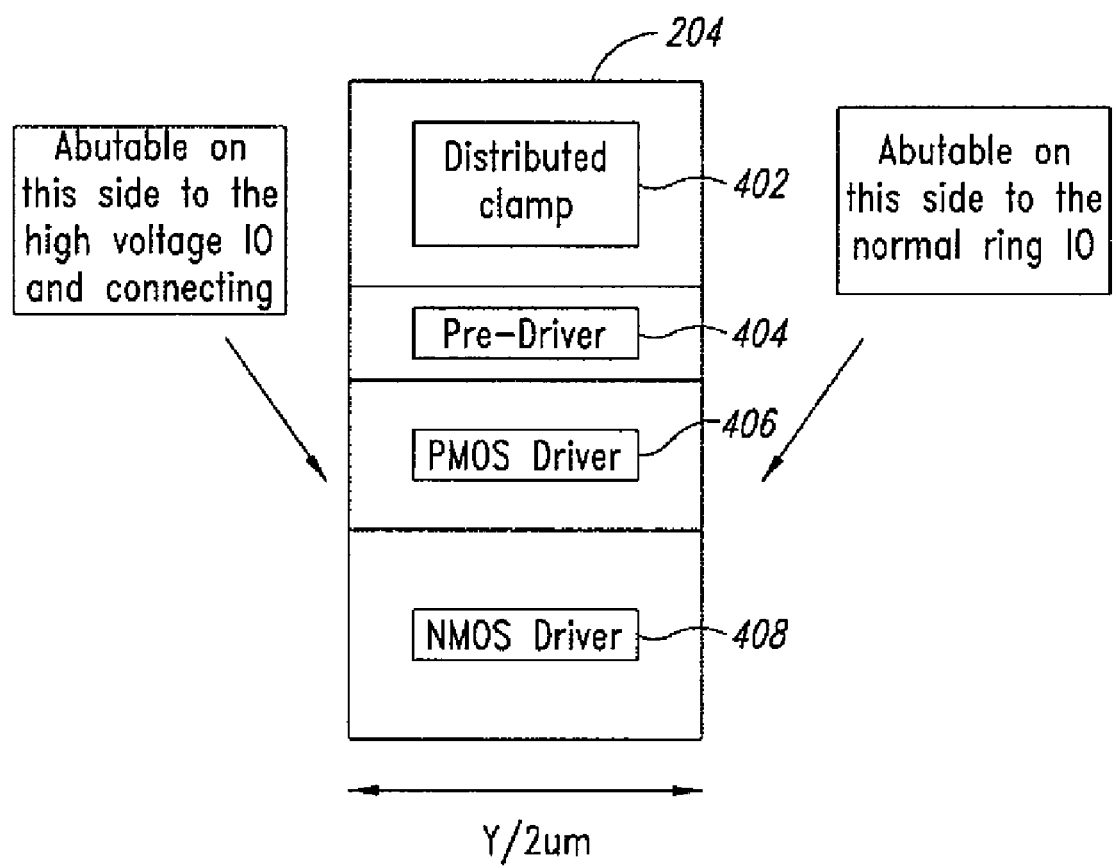
FIG. 5 illustrates the architecture of the IO adder module according to an embodiment of the present disclosure.

FIG. 5 illustrates the architecture of the IO adder module 204 according to another embodiment of the present disclosure. The structure of the IO adder module is similar to the IO buffer module to ensure better compatibility. The IO adder module 204 includes an additional distributed clamp structure 402 in the logic area for preventing inadvertent damage to semiconductor integrated circuits caused by an electrostatic discharge occurring between any two external pins; a small pre driver section 404 PMOS driver 406 and NMOS driver 408. This IO adder module 204 is abutted with the high voltage IO buffer at one side and with the IO ring on the other.

As the IO buffer is migrated from one supply environment to another, the changes are primarily in the output driver sections (NMOS and PMOS) and the pre-driver section. Generally more transistors are needed in the lower supply regime. Also to target generic applications, non-standard drive levels with programmability are the key to achieving an area and performance efficient solution. For example, the standard drive levels of 2 mA, 4 mA, 8 mA do not always fit into a required specification. Sometimes even a 3.0 or 3.5 mA drive is needed. Therefore, it becomes necessary to have a solution that can provide any drive capability ranging from 1 mA to say 10 mA, in steps of 0.5 mA.

Figure 6:
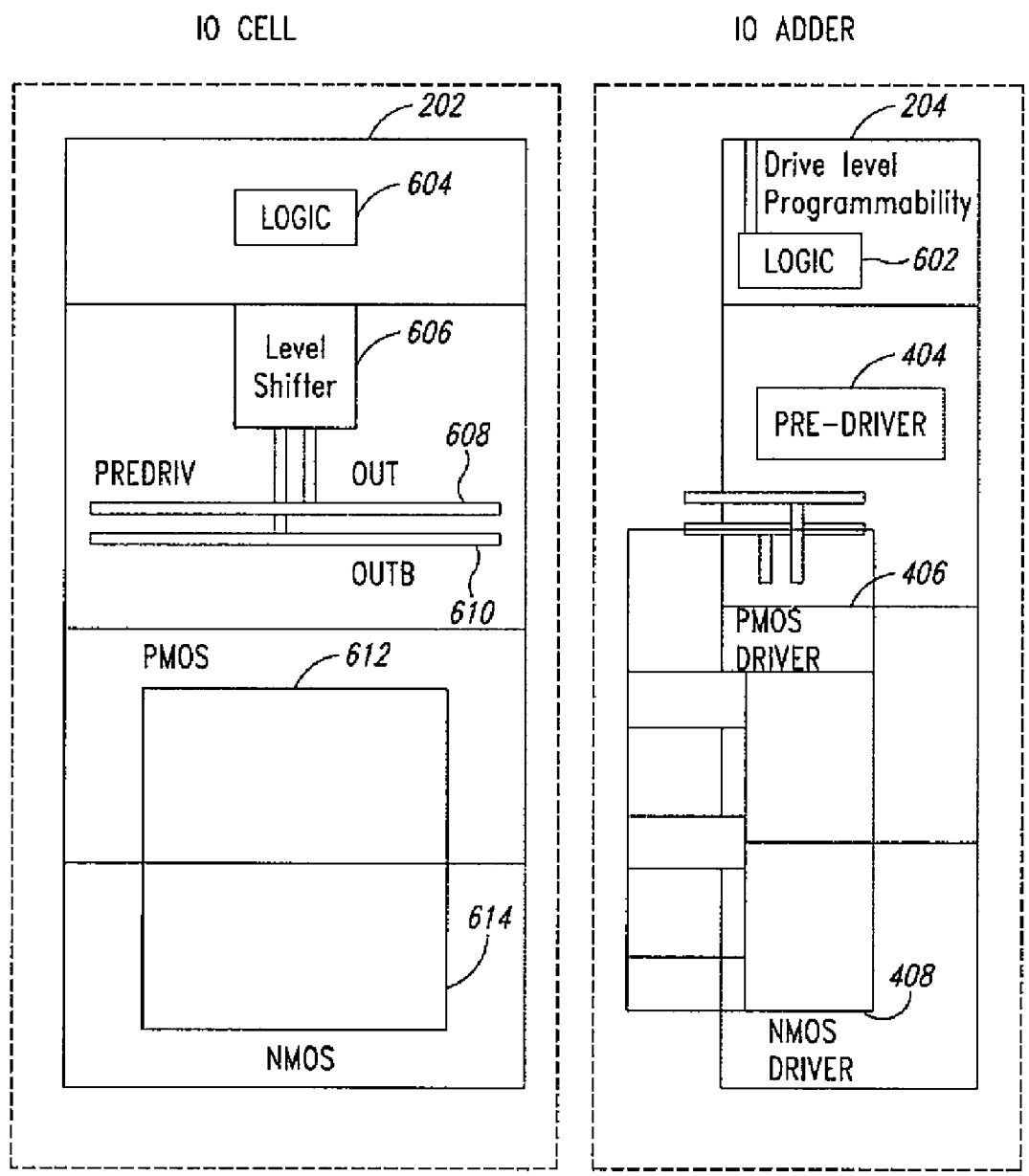
FIG. 6 illustrates the layout architecture of IO buffer and IO adder module on a chip according to yet another embodiment of the present disclosure.

FIG. 6 illustrates the layout architecture of the chip in a low voltage environment derived from the high voltage design by the combination of IO buffer and IO adder module according to yet another embodiment of the present disclosure. It includes IO cell module 202 and IO adder module 204. The IO cell module 202 consists of a logic circuit 604, a level shifter 606, PMOS driver 612 and NMOS driver 614. Further, the IO adder module 204 consists a pass gate 602 as a drive programmable logic placed just before the pre driver section 404 and the other two drivers: PMOS driver 406 and NMOS driver 408. The output signals 608 and 610 of the level shifter 606, acts as an additional interface. This interface is further coupled with the IO adder module which drives the IO adder module.

Figure 7:
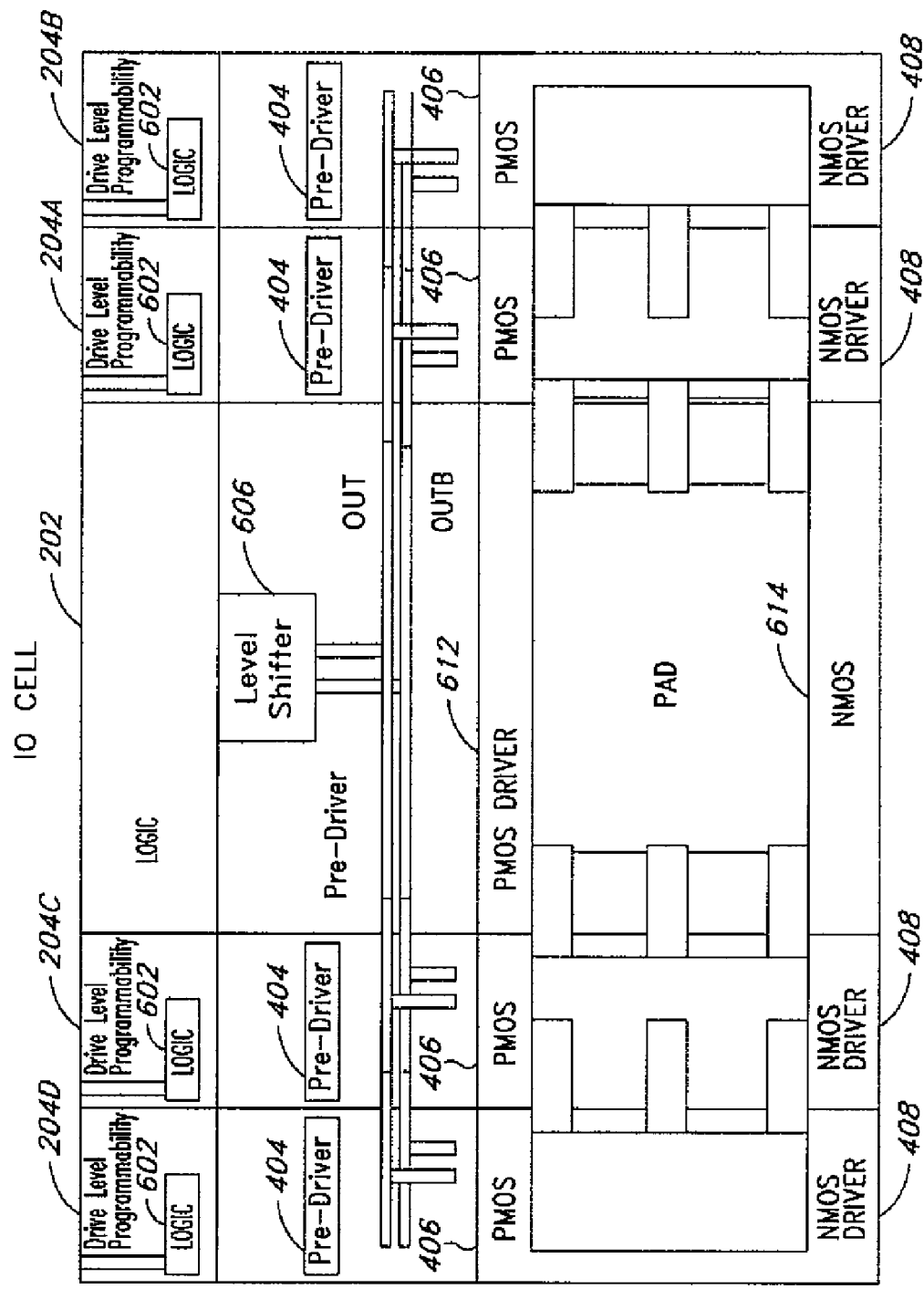
FIG. 7 illustrates the programmable architecture of the IO cell module and IO adder module according to yet another embodiment of the present disclosure.

FIG. 7 illustrates the programmable architecture of the IO cell module and IO adder module according to yet another embodiment of the present disclosure. The IO adder module contains a small pre-driver section 404, tuned to drive the drivers present in it. The input nodes in the IO adder module are placed at the same height as the output nodes of the level shifter.

Further, the metal connections of these inputs in the IO adder module are extended out of the left boundary of the IO adder module 204A, so that when they are abutted to the IO cell module 202, they get shorted with the output nodes of the level shifter 606 present in the IO cell module 202. On the right side of the IO adder module, these inputs are extended, but they are terminated well inside the right boundary of the IO adder module to maintain the metal space rule when the other IO cell module is abutted on right side of the IO adder module. It should be extended until that position so that when several IO adder modules are abutted, input nodes are shorted because of the extended node on left side of each IO adder module, which is finally shorted with the output nodes on the level shifter in the IO cell module.

Figure 8:
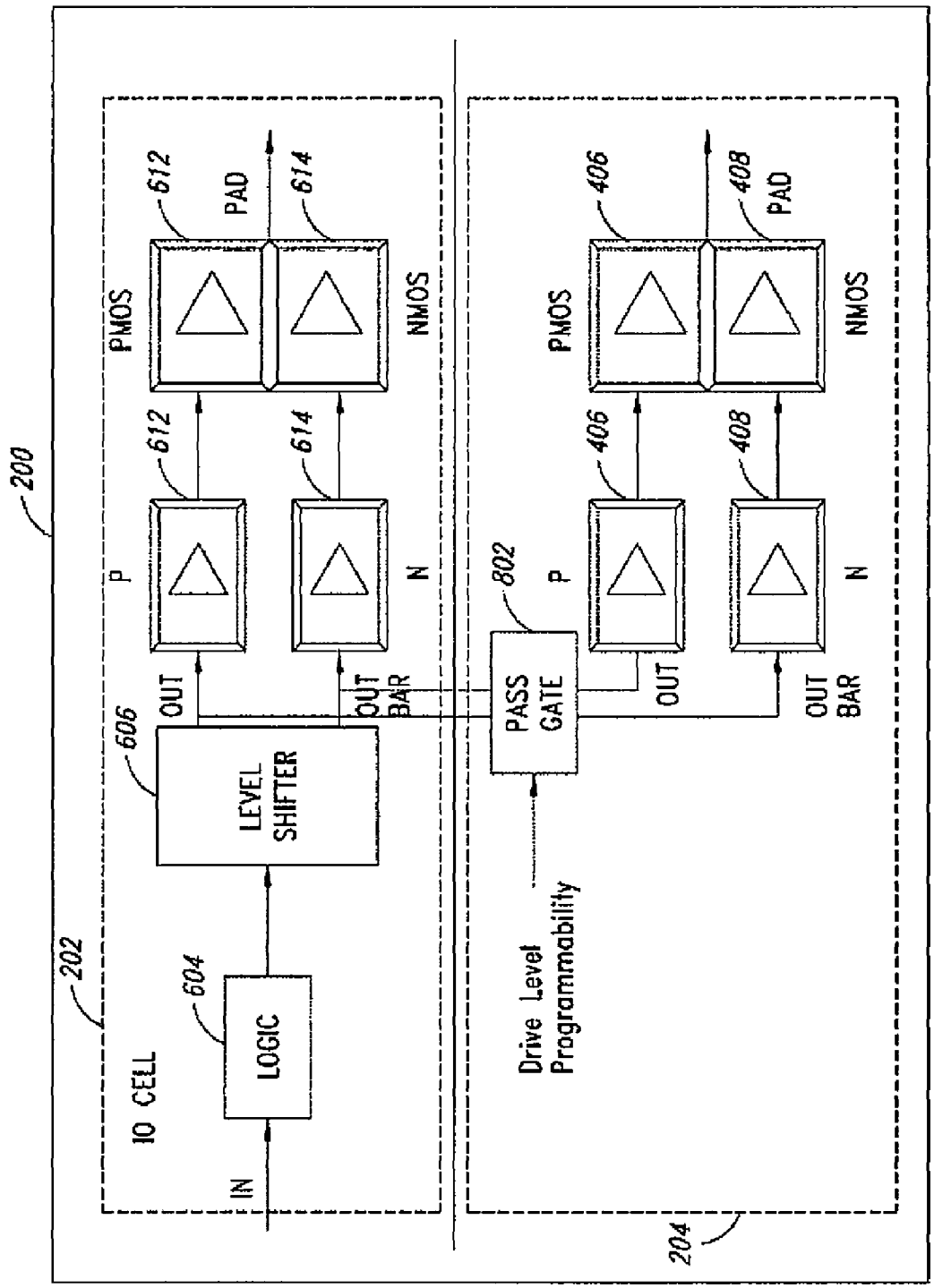
FIG. 8 illustrates the design architecture for the IO cell module and IO adder module according to an embodiment of the present disclosure.

FIG. 8 illustrates the design architecture for the IO cell module and IO adder module according to an embodiment of the present disclosure. In order to have drive level programmability, a pass gate 802 is placed in the logic area just before the pre-driver section in the IO adder module 204. The pass gate 802 is switched ON when the driver needs to be enabled and the pass gate is switched OFF when the driver part in the IO adder module 204 is disabled. This enables to program the drives and tune them for better performance. The vacant space in the IO adder module 204 can also be filled with ESD (electro static discharge) protection or with supply decoupling caps.

Further, to maintain the electro migration rule for the added driver section IO adder, a small metal structure, which is a replica of pad metal structure in the IO cell, is added on the driver part. The metals in this structure are extended on the left side of the IO adder module so that when it is abutted with the IO cell module, the connections of the drive part in the IO adder module are done with the Pad in the IO cell module at each metal level. However the bonding is done on the pad present in the IO cell module. Thus, the Cost of design is the same as the cost of the multi supply IO cell module (hence no additional cost) and the additional drive level programmability feature is present. The drive level for each IO pad can be chosen as per the design need and can be fine tuned with the individual IO cell within board and application constraints. The decoupling caps or parts of the distributed clamp in the vacant area can also be used to reduce the need to use dedicated ESD (electro static discharge) clamps and power supplies inside the design. Also since there is a lower di/dt, a lower supply regime again helps to optimize the power supplies to be used.

Figure 9:
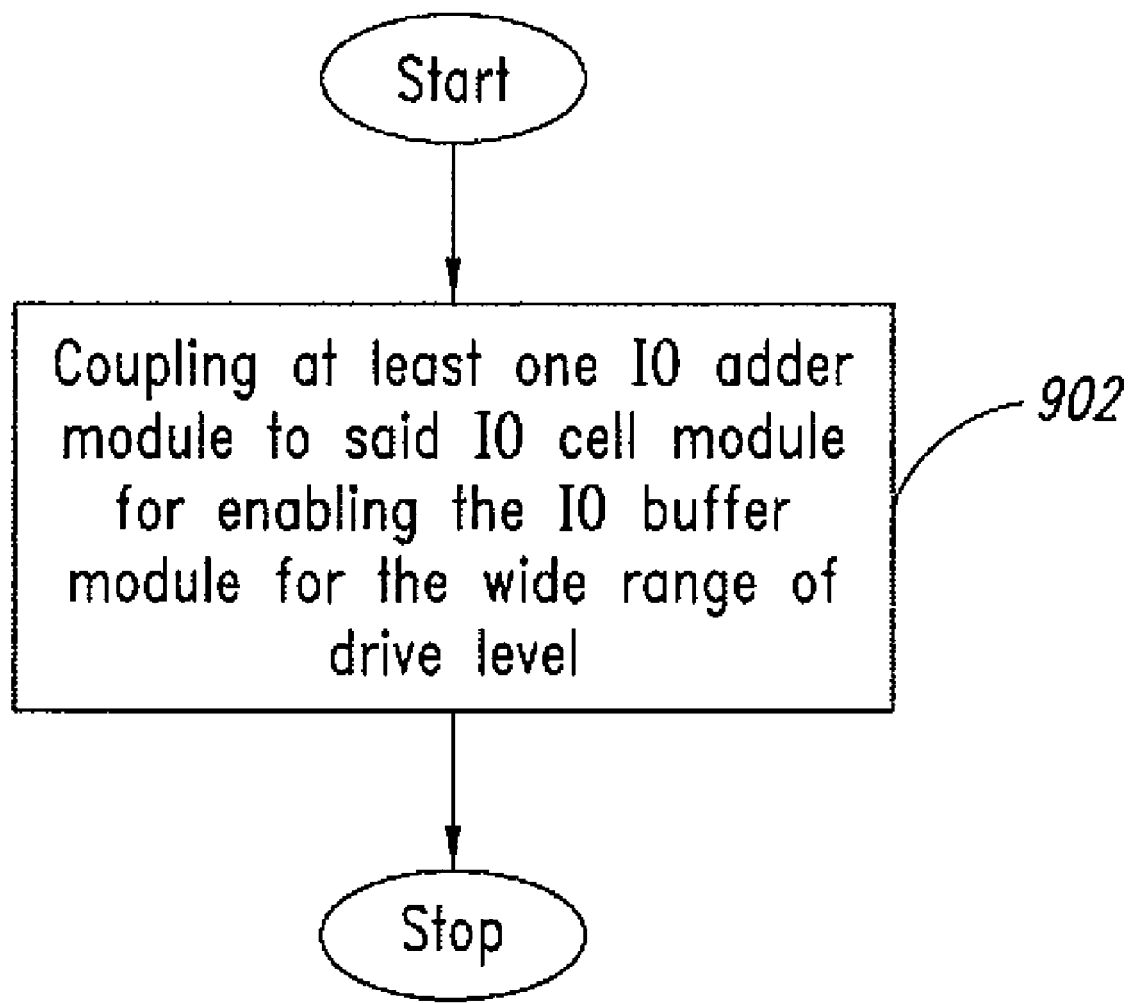
FIG. 9 illustrates a flow diagram for a method for optimizing an IO buffer module for a wide range of drive level according to an embodiment of the present disclosure.

FIG. 9 illustrates a flow diagram of a method for optimizing an IO buffer module for a wide range of drive levels according to an embodiment of the present disclosure. In step 902, at least one IO adder module 204 is coupled to the IO cell module 202 for enabling the IO buffer module 200 for the wide range of drive level. The IO adder module 204 can be coupled with the IO cell module 202 in a number of different combinations for providing the wide range of drive levels. The IO buffer module 200 can provide drive solutions from 1 mA to 10 mA or higher, in steps of 0.5 mA drive level.

The embodiment of the present disclosure can be used in various applications of Inputs/Outputs (IOs) such as in different kinds of chip interfaces (like TTL applications, ECL applications), in various chip to chip communications, an input section of an I/O buffer etc.

Although the disclosure of system and method has been described in connection with the embodiment of the present disclosure illustrated in the accompanying drawings, it is not limited thereto. It will be apparent to those skilled in the art that various substitutions, modifications and changes may be made thereto without departing from the scope and spirit of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
an IO (input/output) buffer module that includes an IO cell module, the IO cell module including:
an IO control logic circuit structured to generate output drive control signals on an output;
a pre-driver having a level shifter with an input coupled to the output of the IO control logic circuit and having an output node formed with metal connectors;
a PMOS driver and an NMOS driver having respective inputs coupled to the output of the pre-driver; and
one or more IO adder modules that include metal connectors and a pre-driver structured to be coupled to the metal connectors of the cell module via the metal connectors on the pre-driver, the metal connectors on the pre-driver in the IO adder modules extend from the one or more IO adder modules at a same height as the metal connectors of the IO cell module, the IO cell module and one or more IO adder modules structured to be abutted together and operatively coupled to enable migration of the IO buffer module from one supply environment to the other.

2. The system of claim 1 wherein each of the one or more IO adder modules includes:
a distributed clamp structure configured to prevent damage from electrostatic discharge; and
a PMOS driver and an NMOS driver having respective inputs coupled to the drive level logic.

3. The system of claim 2 wherein the drive level logic comprises at least one pass gate.

4. The system of claim 1 wherein the metal connectors in each of the IO adder modules extend out of a boundary of the IO adder modules so that when the IO adder modules are abutted to the IO cell module they are shorted with the metal connectors in the output nodes of the level shifter in the IO cell module.

5. An IO (input/output) buffer module for use with one or more IO adder modules that each have a pre-driver and metal connectors extending from the pre-driver, comprising:
an IO cell module structured to provide output drive control signals, the IO cell module having:
an IO control logic circuit structured to generate the output drive control signals on an output;
a pre-driver having a level shifter with an input coupled to the IO control logic circuit output and further having an output node formed with metal connectors that are formed at a same height as the metal connectors extending from the IO adder modules.

6. The IO buffer module of claim 5 wherein the metal connectors in the IO cell module do not extend beyond a boundary of the cell module so that when the IO adder modules are abutted to the IO cell module they are shorted with the output nodes of the level shifter in the IO cell module.

7. A circuit, comprising:
an IO (input/output) buffer module that includes an IO cell module structured to provide output drive control signals, the IO cell module including:
an IO control logic structured to generate the output drive control signals on an output;
a pre-driver having a level shifter with an input coupled to the IO control logic output and at least one output node having metal connectors;
a PMOS driver and an NMOS driver coupled to the pre-driver; and
one or more IO adder modules having a pre-driver structured to be operatively coupled to the metal connectors of the output node of the level shifter via metal connectors formed at a same height as the metal connectors in the IO cell module to provide a range of multiple drive level values, the IO cell module and the one or more IO adder modules structured to be abutted together and operatively coupled to enable migration of the IO buffer module from one supply environment to the other, each one or more adder modules having a structure to prevent damage to the circuit from electrostatic discharge.

8. The circuit of claim 7 wherein the each of the one or more IO adder modules includes:
a distributed clamp structure adapted to prevent the damage from electrostatic discharge; and
a PMOS driver and an NMOS driver having respective inputs coupled to the metal connectors of the one or more IO adder modules.

9. The circuit of claim 8 wherein the drive level logic circuit includes at least one pass gate.

10. The circuit of claim 7 wherein the metal connectors in the IO adder modules extend out of a boundary of the IO adder modules so that when the IO adder modules are abutted to the IO cell module they are shorted with the output nodes of the level shifter in the IO cell module.

11. The circuit of claim 7 wherein the IO cell module includes a pad metal structure configured so that when the IO adder module is abutted with the IO cell module, connections with the drivers of the IO adder module are made with the pad in the IO cell module at each level of metal connectors.

12. The circuit of claim 11 wherein the metal connectors are structured to terminate inside a boundary of the IO adder module to maintain a metal space rule when the IO cell module is abutted to the IO adder module.

13. A system, comprising:
an IO (input/output) buffer module that includes an IO cell module having an IO control logic, a level shifter having inputs coupled to the IO control logic and an output node with metal connectors;
one or more IO adder modules, each of the one or more adder modules having metal connectors and a respective pre-driver coupled to the IO cell module via the metal connectors that extend from the respective IO adder module at a same height as a height of the metal connectors of the IO cell module, each of the one or more IO adder modules including a drive level logic and a distributed clamp structure to prevent damage to the system from electrostatic discharge, and a PMOS and an NMOS driver having respective inputs coupled to an output of the pre-driver of the IO cell module; and the IO cell module and the one or more IO adder modules structured to be operatively coupled together via their respective metal connectors to enable migration of the IO buffer module from one supply environment to the other.

14. The system of claim 13 wherein the metal connectors in the IO adder module extend out of a left boundary of the IO adder modules so that when the IO adder modules are abutted to the IO cell module they are shorted with the output node of the level shifter in the IO cell module.

15. The system of claim 14 wherein the drive level logic comprises at least one pass gate.

16. An IO (input/output) buffer module for use with one or more IO adder modules that each have metal connectors and a pre-driver coupled to the metal connectors, comprising:

an IO cell module that is structured to provide output drive control signals, the IO cell module including:

an IO control logic structured to generate the output drive control signals on an output, and a level shifter having an input coupled to the IO control logic output and further having an output node formed of metal connectors, the metal connectors formed at a same height as the metal connectors in the one or more IO adder modules, the IO cell module structured to be operatively coupled to the one or more IO adder modules to enable migration of the IO buffer module from one supply environment to the other.

17. The IO buffer module of claim 16 comprising a PMOS driver and an NMOS driver coupled to the level shifter.

* * * * *